United States Patent [19]

Hashimoto et al.

[11] Patent Number: 4,888,736

[45] Date of Patent: Dec. 19, 1989

[54] SEMICONDUCTOR MEMORY DEVICE USING STORED CAPACITOR CHARGE FOR WRITING DATA

[75] Inventors: Masashi Hashimoto, Ami; Masayoshi Nomura, Tsuchiura, both of Japan

[73] Assignee: Texas Instruments Incorporated, Dallas, Tex.

[21] Appl. No.: 142,972

[22] Filed: Jan. 12, 1988

[30] Foreign Application Priority Data

Jan. 14, 1987 [JP] Japan .................................... 62-7167

[51] Int. Cl.$^4$ .............................................. G11C 7/00
[52] U.S. Cl. .................................. 365/189.01; 365/200
[58] Field of Search ............... 365/181, 189, 202, 207, 365/208, 205, 200, 210, 222; 307/450

[56] References Cited

U.S. PATENT DOCUMENTS 4,710,900 12/1987 Higuchi .............................. 365/189

Primary Examiner—Joseph A. Popek
Attorney, Agent, or Firm—William E. Hiller; N. Rhys Merrett; Melvin Sharp

[57] ABSTRACT

A semiconductor memory device having a memory portion and a sense amplifier portion through which data is written into, preferably also read out from the memory portion, the improvement in which a capacitor is connected with the sense amplifier portion to perform the writing of the data by the use of charge stored in the capacitor.

7 Claims, 5 Drawing Sheets

SEMICONDUCTOR MEMORY DEVICE USING STORED CAPACITOR CHARGE FOR WRITING DATA

BACKGROUND OF THE INVENTION

1. Field of the Invention

The present invention relates to a memory device.

2. Description of the Prior Art

In the conventional dynamic memory having an array of so-called one-transistor type memory cells, wherein each memory cell comprises a metal oxide semiconductor field effect transistor, either data of the logic state "0" or "1" is memorized byy the memory cell in accordance with whether an MOS capacity is charged or not charged with electrons, as for example, in an n-channel type MOS transistor. Because this charge amount is very small, it is read out as an information, in general, through amplification by a sense amplifier.

The prior sense amplifier is so designed as shown in FIG. 1 that a pair of bit lines ③ and ④, ⑤ and ⑥, ⑦ and ⑧ ... from a memory array area M are connected with each sense amplifier SA. A 256K dynamic random access memory includes 512 to 1024 sense amplifiers SA. In each sense amplifier SA, the respective sides of a p-channel type MOS transistor ㉙ are connected with each other by a line ① and the respective sides of a n-channel type MOS transistor ㉘ are connected with each other by a line ②. These connections assure the function of the sense amplifiers with a smaller occupied area and a high efficiency. But, according to the construction shown in FIG. 1, it is inevitably performed that after data stored in the memory array M is once read out and amplified by the sense amplifier SA, an information of an objective sense amplifier SA is selectively altered by a buffer (inverter) ⑮, ⑯ or ⑰ with a higher current driving capacity than that of the sense amplifier. This procedure is complicated.

The reason of the procedure is as follows. As mentioned above, the charge amount to be read out from the memory array is very small and a potential difference generated according to the charge amount between each pair of bit lines is also very little, generally being not more than 200 mV. The potential difference tends to change very slowly from $t_1$ to $t_3$ as shown in FIG. 2. This is because the bit line itself has an electrical resistance and capacitance of a certain value to cause RC delay for the stored data. In FIG. 2, the dotted line shows a rise timing of a word line on the write or read operation wherein a time of $t_3 - t_1$ is required for the potential shift of the bit lines ⑤ and ⑥ to read out the data. On the other hand, the writing of the data is performed very rapidly provided that it starts simultaneously for each line. The wave form of FIG. 2 is based on an assumption that a set of lines ㉑ is used for writing an information and a set of lines ㉒ is used for reading an information. In more detail, an initial value is set on a stand-by mode or pre-charge mode before the time $t_1$, whereby the terminals ⑨ to ⑪ and ㉔ (See FIG. 1) are set at 0 V to turn only a transistor ㉖ on so as to short-circuit lines ① and ②. In the case where a power supply voltage is 5 V, the potential of line ① or ② is around 2.5 V. And, all of the bit lines ③ to ⑧ are similarly short-circuited to be set at 2.5 V. In FIG. 2, the word line selected at the time $t_1$ shows 5 V or more to output data of a memory element connected therewith on the bit line. As assumed above, the set ㉑ is subjected to the writing operation and so the terminal ⑨ is at 9 V to turn a transistor ⑫ on. If an input data from line ⑱ is 5 V, the potential of the bit line ③ already reaches 0 V at $t_2$. In this case, the bit line ④ is set at 2.5 V to shift the transistor ㉘ to an on state through which the potential of 0 V is transmitted to a node 2 . In the contrary case, the potential of 5 V is transmitted to a node ① through the transistor ㉙. Whereas the potential of the terminal ㉔ is still 0 V at that time to short-circuit nodes ① and ② through the transistor ㉖, nodes ① and 2 are chargeable to be set at 2.5 V and 0 V respectively in the area adjacent to the write lines ㉑ because of significant capacitance and resistance of nodes ① and ②. Consequently, the sense amplifier SA in the vicinity of the nodes is liable to start a sensing operation. This is the well-known malfunction called presensing.

To avoid the presensing in the prior art, data of memory cells are first read out in both cases of the writing and reading operations. At the time the amplification of the data is over ($t_4$ of FIG. 2), the portion requiring the writing of data is electrically connected with the buffer, that is, the potential of terminal ⑨ is 5 V after $t_4$. The buffer is functioned to forcibly alter the data of the sense amplifier so as to prevent the presensing.

At the time of the alteration of the data, electric current flows through the circuit. However, in the prior technique as generally applied to memories, data of one bit or four bits or the like is simultaneously altered to cause no relatively significant problem. But, in the case of a FIFO (First-In, First-Out) memory device mentioned later, it becomes necessary to simultaneously alter the data of 256 bits or more, which results in a large electric current being required. This large electric circuit is not advantageous, for example, in view of the power consumption caused thereby.

OBJECTS AND SUMMARY OF THE INVENTION

Accordingly, an object of the present invention is to provide a memory device which is free from presensing and which enables the alteration of stored data with a small electric current.

Namely, the invention provides a memory device having a memory portion and a sense amplifier portion through which data is written into the memory portion and, preferably also read out from the memory portion, wherein a capacitance element is connected with the sense amplifier portion so as to form the writing of data into the memory portion by the use of charge stored in the capacitance element.

Other objects, features and advantages of the invention will appear more fully from the following detailed description thereof taken in connection with the accompanying drawings.

DESCRIPTION OF THE PREFERRED EMBODIMENTS

Figure 1:
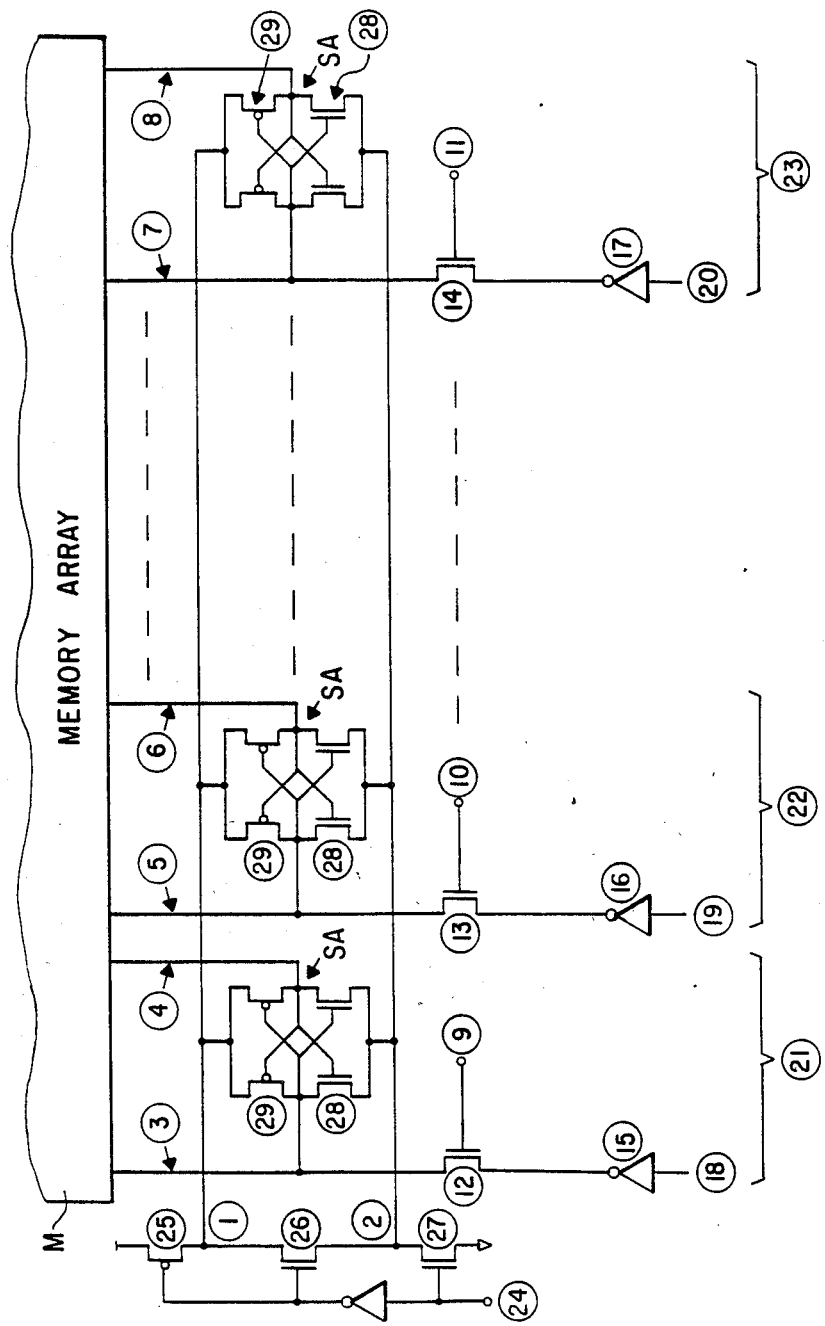
FIG. 1 is a circuit diagram of a main part of a semiconductor memory device of the prior art.
Figure 2:
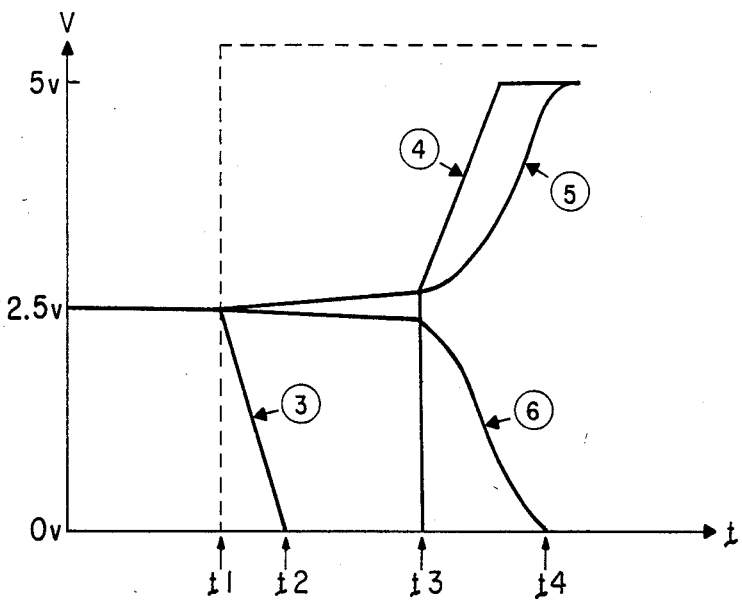
FIG. 2 is a wave form of voltage appearing in a bit line.

The invention will be now explained with reference to the embodiments. In the drawings of the embodiments, the structural components common to those of FIG. 1 are identified by the same reference numerals or symbols and the description of such common structural components is abbreviated according to the circumstances to avoid repetition.

Figure 3:
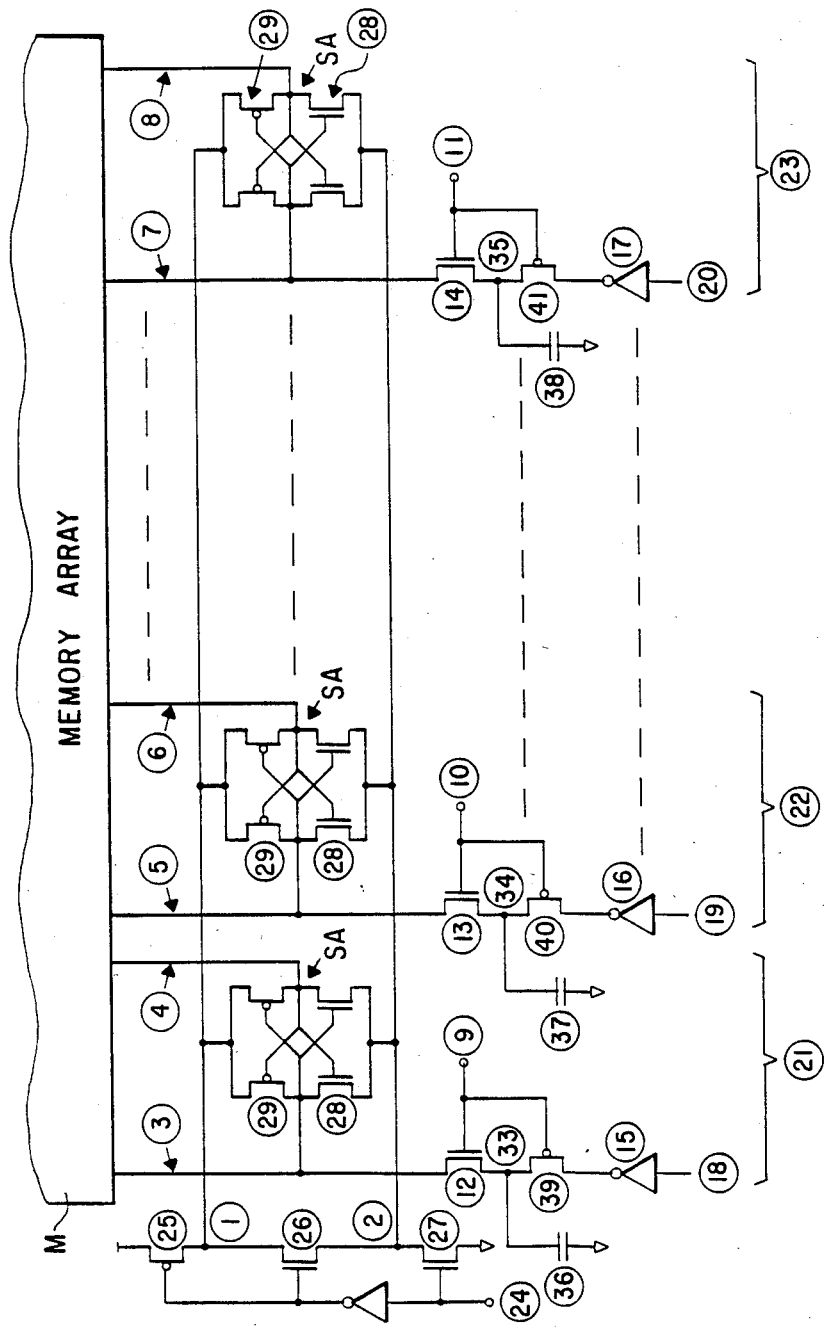
FIG. 3 is a circuit diagram of a main part of a semiconductor memory device embodying the invention.

FIG. 3 shows an example of a circuit for writing and reading data in a MOS dynamic memory device according to the invention.

For example, when the set of lines (21) is subjected to the writing operation, information supplied from the write line (18) is written into a capacitor (36) through a p-channel transistor (39). The writing of the data into the memory array is carried out in a similar way to the writing of data into the conventional memory array shown in FIG. 1 in that the voltage source at terminal (9) is set at 5 V to turn the transistor (12) on. The transistors (12) and (39) comprise a CMOS device. Because the transistor (39) is off, the writing of the daata is not performed through the buffer inverter (15), but through the capacitance element (36) from which charge stored therein is discharged. In this case, if the capacitance of the element (36) is sufficiently larger, preferably more than two times of that of the memory array, the data can be truly transmitted to the sense amplifier even when it is opposite in value to the information read out at the bit line (3) from the memory array. The capacitance of the element (36) is preferably more than two times of that of the memory array which is generally 50 FF, more preferably the former is 3-5 times that of the latter.

In the circuit of FIG. 3, to prevent the presensing of the sense amplifier SA, the data is initially read out from the memory array and then the writing or alteration of data is performed by the element (36).

As described above, according to the embodiment of the invention, the writing of data is performed not by each buffer inverter, but by the charge stored beforehand in the capacitor (36) through the buffer, which results in the performance of selective writing with reliability by a necessary amount of charge so that current consumption decreases in amount.

Next, there is provided an example as shown in FIGS. 4 to 7 in which the above-described circuit of FIG. 3 is applied to a FIFO memory.

In the FIFO memory, a memory array is divided into two portions $M_1$ and $M_2$ to which respective write line buffers are connected. Accordingly, data serially input is successively written from the top item into the write line buffer so that when the first half of the write line buffer is occupied byy the input data and the writing into the latter half of the write line buffer starts, the data of the first half is written into the memory array. At this time, the read-out operation for data of the latter half ($M_2$) of the memory array is carried out. The basic design of the device is provided with line buffers for serial-parallel and parallel-serial conversion of data, further having a ring oscillator or oscillators or a similar oscillator or oscillators, a counter or counters to count oscillation pulses from such oscillators, a mechanism to generate the read and write request signals, a circuit to generate the refresh signal, and an arbiter circuit to determine priority between read, write and refresh signals as these signals are generated depending on circumstances.

Figure 4:
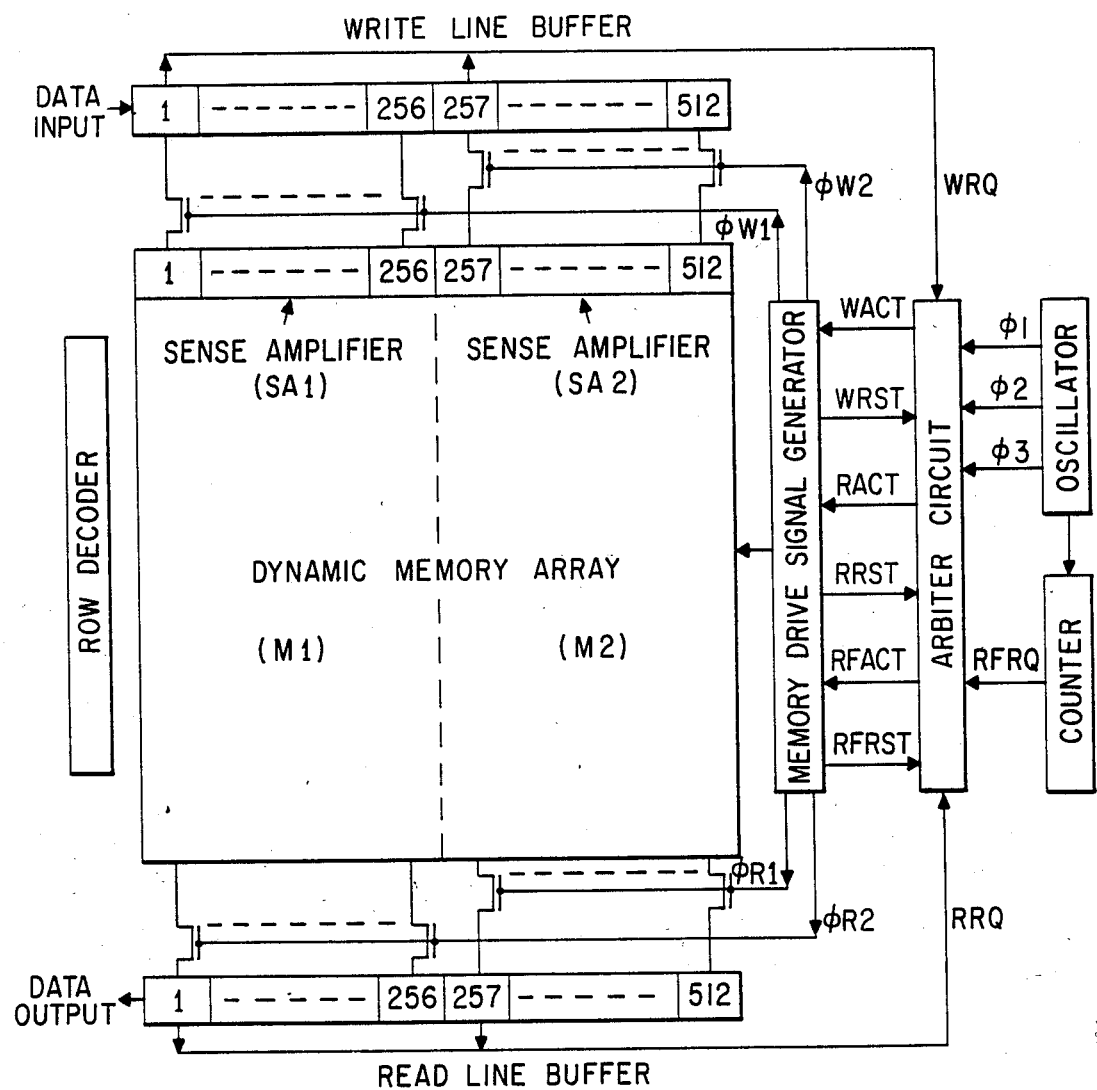
FIG. 4 is a schematic diagram of a FIFO memory device.

In FIG. 4, in consideration of descriptional convenience, it is assumed that there are provided a parallel array of 512 sense amplifiers arranged in parallel relation to the rows of dynamic memory elements with the write and read line buffers connected to these sense amplifiers for parallel input and output, respectively. There is a continuous input of serial data to the write line buffer with serial data read out from the read line buffer for continuous output. For these input and output circuits, any known means for serial data input and output, respectively, with a special addressing circuit built in may be used. Such input and output circuits may also be structured otherwise, for example, by an approach as applied to the VRAM (Video RAM). Accordingly, the explanation about the operation of line buffers is omitted herein. However, the sense amplifiers disposed on the side of the write line buffer sections are divided into sense amplifier sections $SA_1$ and $SA_2$. These respective arrays of sense amplifiers $SA_1$ and $SA_2$ are used in common for both writing and reading.

In the FIFO memory, respective sense amplifiers as shown in FIG. 3 are connected with the write line buffer. The sense amplifiers are respectively connected by the transistors (12) to (14), (39) to (41) and the capacitors (36) to (38). Even when 256 bits of the circuit elements function together when the written data is altered, this is performed by the discharge current from the capacitors (39) to (41) so as to decrease the amount of current necessary for the writing of data.

Data is written by the following sequence of steps (1) to (6) in the circuit of FIG. 4.

(1) Data is written into the write line buffer sequentially as these data are input serially from an outside data input source. Here a serial write clock may be used to operate the pointer for addressing control of input data. As the 256th data bit has been written and at the start of the next 257th data bit write cycle, namely, when the pointer indicates the address 257, a write request signal WRQ (=1=true) is generated as shown in FIG. 5 to write the 1st through the 256th data bit stored in the write line buffer into the dynamic memory elements.

Figure 5:
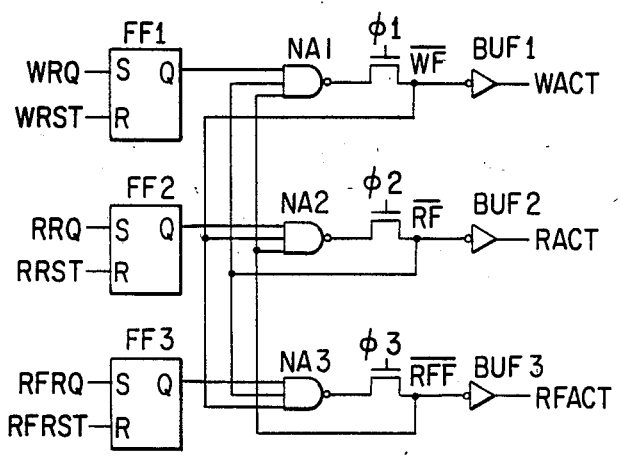
FIG. 5 is an equivalent circuit of the major part of an arbiter circuit used in the device of the invention.
Figure 6:
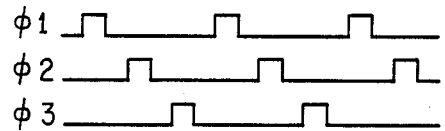
FIG. 6 is a timing chart of control signals applied to the arbiter circuit.

(2) The signal WRQ is applied to the set terminal of the flip-flop FF1 of arbiter circuit as shown in FIG. 5. As the WRQ signal becomes true, the output terminal Q of FF1 is also set true. If the output Q of FF1 becomes true with both $\overline{RF}$ and $\overline{RFF}$ true, the output of NA1 is set false (=0), so $\overline{WF}$ is also set false at the timing of $\phi 1$. The write control signal WACT and also a memory driver signal $\phi w1$ of FIG. 4 are thus set true. The condition under which both $\overline{RF}$ and $\overline{RFF}$ are true will be mentioned later. It is noted that the circuit is designed in such a manner that $\phi w1$, $\phi w2$, $\phi R1$ and $\phi R2$ as shown in FIG. 4 are normally false. As the WACT is set true after the write pointer has counted up to 257 or counted up to 200 and then reset to 0, $\phi w1$ or $\phi w2$, respectively, is set true. Similarly, $\phi R1$ or $\phi R2$ is set true when the read pointer reaches 257 or 0, respectively.

(3) As the WACT signal becomes true, this signal is transmitted to the dynamic memory drive signal generator. Data is then written in the memory by the same operation as applied when data is written in the ordinary DRAM.

(4) After data is written, the dynamic memory drive signal generator generates a signal WRST (=1=true) to reset the WACT.

(5) This WRST is applied to the reset signal input terminal of FF1, returning Q back to the false state 0. As a result, the $\overline{WF}$ returns back to the true state 1 at the timing $\phi$1.

(6) After the 512th data has been written, the write pointer returns back to the address No. 1 to write new input data from this address and at the same time a signal WRQ is generated to set the WACT and $\phi$w2 true by the same procedure.

Data is thus written continuously.

To read out data, 1st through 256th data are read and stored beforehand in the read line buffer and a read request signal PRQ is generated at the timing when the 1st data is read out. If both $\overline{WF}$ and $\overline{RFF}$ are true, $\overline{RF}$ then becomes false at the timing $\phi$2 to set the RACT and $\phi$R1 true, stating an operational sequence to output 257th through 512th data to the read line buffer. Through similar operational sequences, a series of stored data can be continuously read out.

For refreshing, the oscillation frequency of an oscillator is divided by a proper counter to repeatedly generate a refresh request signal RFRQ at a proper cycle.

The approach as mentioned above has so far not been applied to the DRAM or the like for a reason as mentioned in the next paragraph.

The read and writetiming control of DRAM has hitherto been a task that must be solved by the user himself. It is therefore not possible to forecast when write and read control signals are generated. Accordingly, as obvious from the circuit of FIG. 5, with the memory circuit configuration in which an approach of the example of FIGS. 4 to 6 to generate the refresh request signal internally is used, once the refresh mode starts, any other request that may occur cannot be respondes to immediately but must wait until the ongoing refresh mode is completed. Since this leads to an increase in the access time, the above approach has not been feasible. If data is accessed serially, however, it is possible to forecase the timing when necessary data appears next. Therefore, if line buffers are built in to write and read data in batches of adequate size and if necessary data is, for example, read not by directly accessing the dynamic memory that operates rather slowly but serially through a line buffer fast enough, there will be no practical difficulty in reading data, for example, even if a read request signal is generated during the refresh mode and therefore data read from main memory starts after the end of an ongoing refresh mode.

For example, let us assume 30 nsec for the maximum bit rate both for serial data reading and writing and 300 nsec for the cycle time to read, write or refresh data in the dynamic memory. For example, even when write, read and refresh requests to write, read and refresh, respectively, data in the dynamic memory are generated simultaneously and the read request is executed last, necessary data will always have been written in the read line buffer 900 nsec later. Accordingly, it is only necessary to generate a read request signal at least 30 bits earlier than when data becomes necessary. Namely, if the line buffer is designed for a storage capacity of 30 bits×2, namely, 60 bits, the memory will work without any difficulty in data reading.

If line buffers having a bit capacity based on a similar calculation are built in, therefore, a practically refresh-free memory of serial data access type will be provided.

It is noted that in the example of FIG. 4 through data is read and written unsynchronously, an external clock may be used for synchronous write and read. Further, each line buffer is configured of memory units all in series but a modification is possible to have data Nos. 1 to 256 in parallel to data Nos. 257 to 512.

As mentioned above, the device of FIG. 4 is so designed that an internal circuit may refresh data without recourse to any external signal. So an efficient memory device can be provided which is capable of reading and writing data even in the refresh mode without any burden on the user in designing the refresh control circuit.

Figure 7:
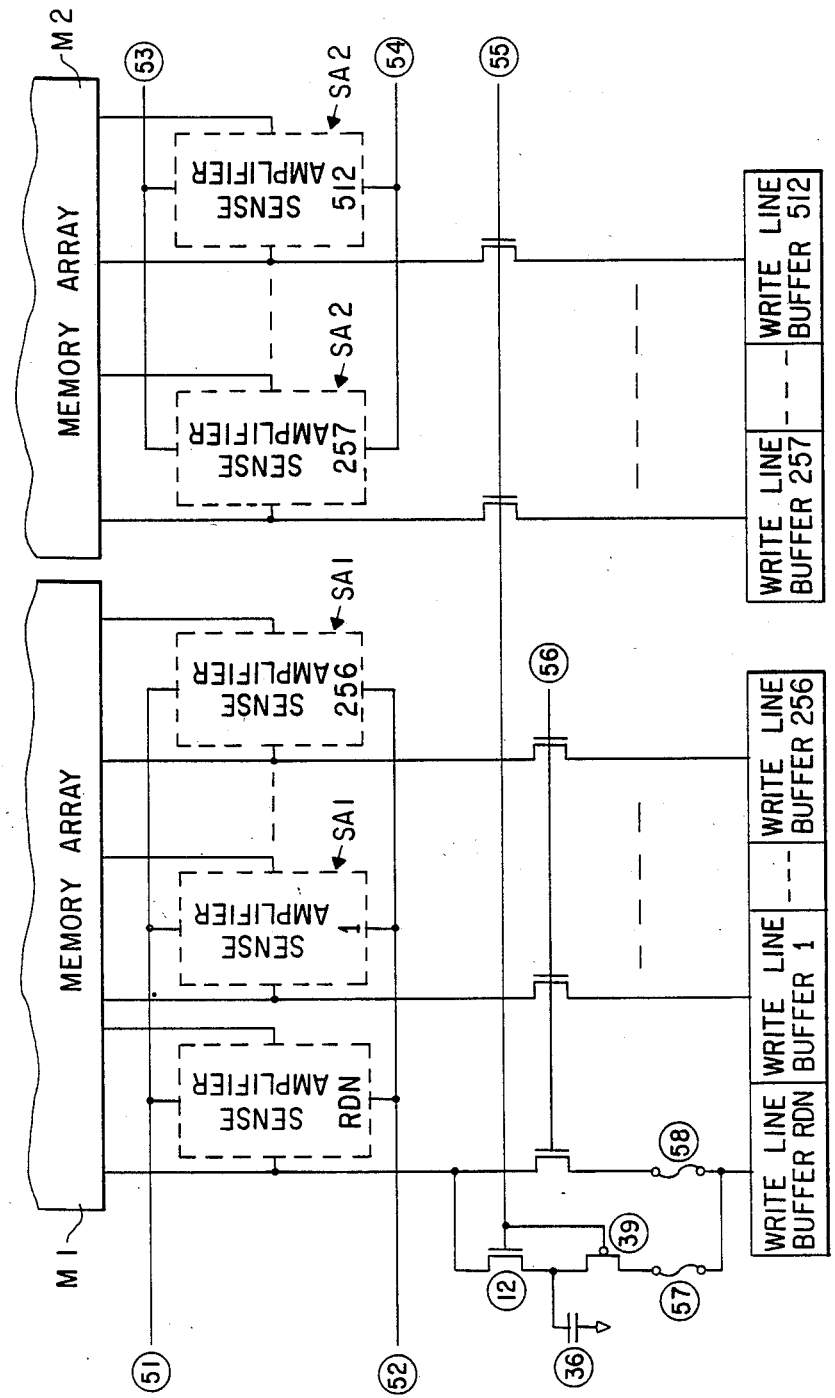
FIG. 7 is a circuit diagram of a main part of a semiconductor memory device of another example of the invention.

In FIG. 4 new input data is successively supplied from the exterior and the data already written in the latter half of the memory array is not necessary to be stored therein. This means that malfunction of the circuit is not harmful thereto. However, when the latter write line buffer is then coupled with the data and input data begins to be written in succession into the first half of the write line buffer, the transmission of the data of the latter half of the write line buffer to the memory array should be truly performed. This is because new data written immediately before that time is read out from the first half of the memory array. The transmission of the data can be made with reliability by the circuit design as shown in FIG. 7 wherein the common line through each sense amplifier is separated into two portions for the first half and the second (latter) half of the memory array. In this case, contrary to the prior art, a line (55) is first set to 5 V to supply the data from the write line buffer data positions 257 to 512 to the sense amplifiers 257 to 512 and then these sense amplifiers are operated. This operation makes it unnecessary to invert the sense amplifiers and the use of a large amount of current for such inversion is prevented.

The circuit for writing and reading can be applied to a redundant circuit as shown in FIG. 7 wherein a redundant bit RDN is positioned at the first half of the memory array and a defective bit exists in the latter half of the memory array. In this case, a fuse (58) is cut. Though a sense amplifier RDN might malfunction on the writing of data into the first half of the memory, it turns to the true state on the next writing of data into the latter half of the memory. Primarily, the data formerly written is to be kept until new data comes, however, this is unnecessary for the circuit of FIG. 4. If the defective bit is in the first half of the memory, a fuse (57) is cut. This assures a reliable operation entirely same as the sense amplifiers 1 etc.

It will be evident that various modifications can be made to the described embodiments without departing from the scope of the present invention.

For example, the above-described memory can comprise a random access memory and so on. The sense amplifiers and the circuit including the capacitance element can be modified in construction.

According to the invention, the writing of data is carried out through the sense amplifier by the stored charge of the capacitance element, so that current required for the writing of data can be effectively decreased while the presensing of the sense amplifier is prevented by initially reading out the data through the sense amplifier prior to the data writing operation.

What is claimed is:

1. A memory device comprising:

a dynamic memory cell;

a bit line connected to said dynamic memory cell;

data input means operably connected to said bit line for writing data in said dynamic memory cell;

transistor switch means in said bit line and including a transistor having a gate and normally disposed in a non-conductive state;

a capacitance element connected to a node on said bit line disposed on the opposite side of said transistor from said dynamic memory cell;

said data input means providing a charge on said bit line when said transistor is non-conductive;

said capacitance element receiving and storing said charge from said data input means;

a voltage source connected to the gate of said transistor and operable to supply voltage thereof to render said transistor conductive; and data being written into said dynamic memory cell from the discharging of charge stored in said capacitance element in response to the application of voltage from said voltage source to said gate of said transistor rendering said transistor conductive.

2. A memory device as set forth in claim 1, wherein said transistor switch means in said bit line comprises first and second complementary FET transistors serially arranged in said bit line and having commonly connected gates, said first transistor being normally conductive and said second transistor being said transistor normally disposed in a non-conductive state;

said node on said bit line to which said capacitance element is connected being disposed between said first and second transistors;

said data input means providing the charge on said bit line when said first transistor is conductive and said second transistor is non-conductive;

said voltage source being connected to said gates of said first and second transistors and operable to supply voltage thereto to render said first transistor non-conductive and said second transistor conductive; and data written into said dynamic memory cell from the discharging of charge stored in said capacitance element in response to the application of voltage from said voltage source to said gates of said first and second transistors rendering said first transistor non-conductive and said second transistor conductive.

3. A memory device comprising:

a dynamic memory cell;

a sense amplifier connected to said dynamic memory cell;

a bit line connected to said dynamic memory cell and having a first node thereon connected to said sense amplifier;

data input means operably connected to said bit line for writing data in said dynamic memory cell;

first and second complementary FET transistors serially arranged in said bit line and having commonly connected gates, said first transistor being disposed between said data input means and said second transistor, and said second transistor being disposed between said first node on said bit line and said first transistor, said first transistor being normally conductive;

a capacitance element connected to a second node on said bit line disposed between said first and second transistors;

said data input means providing a charge on said bit line when said first transistor is conductive and said second transistor is non-conductive;

said capacitance element receiving and storing said charge from said data input means;

a voltage source connected to said gates of said first and second transistors and operable to supply voltage thereof to render said first transistor non-conductive and said second transistor conductive; and data being written into said dynamic memory cell from the discharging of charge stored in said capacitance element in response to the application of voltage from said voltage source to said gates of said first and second transistors rendering said first transistor non-conductive and said second transistor conductive.

4. A memory device as set forth in claim 3, wherein the capacitance of said capacitance element is sufficiently larger than that of said dynamic memory cell.

5. A semiconductor memory device capable of FIFO data operation, said semiconductor memory device comprising:

dynamic memory array means having first and second dynamic memory arrays, each of said first and second dynamic memory arrays including a plurality of dynamic memory cells arranged in a matrix of rows and columns and having respective inputs and outputs;

write line buffer memory means having first and second write line buffer memories disposed at the inputs of said first and second dynamic memory arrays for serial-parallel conversion of write data as input therefrom into the dynamic memory cells of said first and second dynamic memory arrays;

read line buffer memory means having first and second read line buffer memories disposed at the outputs of said first and second dynamic memory arrays for parallel-serial conversion of read data as output from the dynamic memory cells of said first and second dynamic memory arrays;

sense amplifier means having first and second sense amplifier sections interposed between said first and second dynamic memory arrays and said first and second write line buffer memories, each of said first and second sense amplifier sections including a plurality of sense amplifiers corresponding in number to the dynamic memory cells defining a respective row of dynamic memory cells of said first and second dynamic memory arrays;

control circuit means connected to said dynamic memory array means, said write line buffer memory means, said read line buffer memory means, and said sense amplifier means for regulating data transfer so that said first and second write line buffer memories and said first and second read line buffer memories are respectively operable in tandem in inputting data to and outputting data from said first and second dynamic memory arrays;

each of said dynamic memory cells included in the respective rows of dynamic memory cells located at the inputs of said first and second dynamic memory arrays having a bit line;

each bit line having a first node thereon connected to a corresponding one of said sense amplifiers included in said first and second sense amplifier sections;

data write means interposed between said write line buffer memory means and said sense amplifier means, said data write means comprising:

first and second complementary FET transistors serially arranged in each bit line and having commonly connected gates, said first transistor being disposed between said write line buffer memory means and said second transistor, and said second transistor being disposed between said first node on said bit line and said first transistor, said first transistor being normally conductive, a capacitance element connected to a second node on each bit line disposed between said first and second transistors, said write line buffer memory means selectively providing respective charges on respective bit lines when said first transistor is conductive and said second transistor is non-conductive, said capacitance element receiving and storing said charge from said write line buffer memory means for each of the selected bit lines, a voltage source connected to the gates of said first and second transistors for each of said bit lines and operable to supply voltage thereto to render said first transistor non-conductive and said second transistor conductive, and data being written into selected ones of said dynamic memory cells in the row of dynamic memory cells located at the input of one of said first and second dynamic memory arrays from the discharging of charge stored in said capacitance element corresponding to selected bit lines in response to the application of voltage from said voltage source to said gates of said first and second transistors for each of said bit lines rendering said first transistor noon-conductive and said second transistor conductive.

6. A semiconductor memory device as set forth in claim 5, further including at least one redundant dynamic memory cell included in one of said first and second dynamic memory arrays and having a redundant bit line connected thereto;

a redundant sense amplifier;

said redundant bit line having a first node thereon connected to said redundant sense amplifier;

said data write means including redundant first and second complementary FET transistors serially arranged in said redundant bit line and having commonly connected gates;

a capacitance element connected to a second node on said redundant bit line disposed between said first and second transistors;

said voltage source being connected to said gates of said first and second transistors serially arranged in said redundant bit line and operable to supply voltage thereto to render said first transistor non-conductive and said second transistor conductive;

circuit-breaker means disposed in said redundant bit line between said first transistor and said write line buffer memory means; and said redundant dynamic memory cell providing a redundant data bit for replacement of a defective bit from a defective dynamic memory cell located in the same one of said first and second dynamic memory arrays as said redundant dynamic memory cell and being rendered inoperable in response to the actuation of said circuit-breaker means disconnecting said redundant bit line from said write line buffer memory means.

7. A semiconductor memory device as set forth in claim 6, wherein said circuit-breaker means comprises a fusible link in said redundant bit line subject to interruption in response to a control signal to disconnect said data write means from said write line buffer memory means.

* * * * *